(12) United States Patent
Fukui (10) Patent No.: US 6,418,849 B1
(45) Date of Patent: Jul. 16, 2002

(54) SHEET BODY FIXING DEVICE HAVING CLAMP WITH UNIFORM NIPPING FORCE

(75) Inventor: Takashi Fukui, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/767,696

(22) Filed: Jan. 24, 2001

(30) Foreign Application Priority Data

Jan. 24, 2000 (JP) .......................................... 2000-015006

(51) Int. Cl.7 ............................ B41F 21/04; B41F 27/12
(52) U.S. Cl. ...................... 101/409; 101/415.1; 271/82; 271/277
(58) Field of Search .............................. 101/415.1, 409, 101/463.1, 467; 355/72, 85, 104; 271/82, 85, 204, 275, 277; 347/264

(56) References Cited

U.S. PATENT DOCUMENTS 6,164,204 A * 12/2000 Kawada et al. ............. 101/409

6,189,452 B1 * 2/2001 Halup et al. ............. 101/415.1

* cited by examiner

*Primary Examiner*—Leslie J. Evanisko
(74) *Attorney, Agent, or Firm*—Sughrue Mion, PLLC (57) ABSTRACT

When a sheet body such as a printing plate or the like is wound onto a rotation drum, the sheet body is securely fixed to the rotation drum and after being fixed, the coming up of the sheet off the drum is kept at a minimum. In the clamp having two support points, the position of the support points are determined such that the amount of deformation caused when a centrifugal force generated when the rotation drum rotates at a high speed, acts against an urging force of the clamp, in the dimension between the support points and the dimension between the support points and one end portion, is substantially uniform along the entire length of the clamp portion. Thus, the nipping force is uniform along the entire clamp and the printing plate, and the disadvantage of the printing plate inclining on the rotation drum is eliminated.

6 Claims, 8 Drawing Sheets

SHEET BODY FIXING DEVICE HAVING CLAMP WITH UNIFORM NIPPING FORCE

BACKGROUND OF THE INVENTION

1. Field of the Invention

The present invention relates to a chuck and a fixing device for holding a sheet body in a state in which the sheet body is wound onto a periphery of a rotation body, and to an image recording device.

2. Description of the Related Art

In general, in printing, a photosensitive printing plate (referred to as a printing plate hereinafter) in which a photosensitive layer is formed on a support body formed of a sheet such a thin aluminum plate and the like is used. This printing plate is used as a printing plate for printing after an image is recorded due to exposure, and a development process or the like is carried out.

This type of printing plate includes one in which, in the image exposure device for carrying out image exposure, the printing plate is wound onto a rotation drum and held, then while the rotation drum is rotated at a high speed, a light beam is radiated onto the printing plate in accordance with the image data for recording on the printing plate, to thereby scan-expose the printing plate.

Image exposure devices in which a rotation drum is used to expose the printing plate include a type which uses a fixing device which, when the printing plate is wound onto the rotation drum, clamps the non-image portions of both ends of the printing plate which are along a circumferential direction of the rotation drum, between the drum and itself. In this type of a fixing device, the printing plate, generally, the clamp portion which opposes the printing plate is urged in the circumferential direction of the rotation drum by an urging force, and the printing plate is thereby nipped between the clamp portion and the rotation drum.

In this case, by the clamp portion being fit into a plurality of grooves which are provided in the circumferential direction of the rotation drum, the grooves serve as support points and the clamp portion is fixed to the rotation drum.

However, when the rotation drum is rotated at a high speed in a state in which a sheet body such as a printing plate is wound onto the rotation drum, a centrifugal force is exerted on the clamp portion causing the holding force to decrease.

It may be thought that if the number of support points is increased, the clamp portion will be firmly held onto the rotation drum, but if the number of support points is increased, the number of grooves on the rotation drum also has to be increased. If maintaining the continuity of a surface such that there are no uneven portions when winding the printing plate onto the peripheral surface of the drum is considered, the number of grooves that can be formed is limited. Thus, it becomes necessary to form a clamp that is formed of a material having high rigidity.

As a result of this, the weight is increased, and due to increase in the rotational torque, it becomes necessary to increase the driving force of the clamp. It also becomes necessary to increase the durability and the like of the support structure and this causes obstruction in other sections. It is therefore not preferable that the clamp be formed of a material having high rigidity.

In view of the above, the object of the present invention is to provide a sheet body fixing device in which when a sheet body such as a printing plate or the like is wound onto a rotation drum, the sheet body is securely fixed to the rotation drum and the coming up of the sheet off the drum surface after the fixing is kept at a minimum.

SUMMARY OF THE INVENTION

The invention according to a first aspect of the present invention is a sheet fixing device for holding a sheet in a state in which the sheet is wound around a peripheral surface of a rotation drum, the sheet fixing device comprising:

a clamp portion disposed along an axial direction at one portion of the peripheral surface of the rotation drum, at least one of a leading end portion and a trailing end portion of the sheet being nipped between the clamp portion and the peripheral surface of the rotation drum; and a fixing element which fixes the clamp portion to the peripheral surface of the rotation drum at a plurality of support points along an axial direction of the rotation drum, wherein when the clamp portion is fixed to the rotation drum by the fixing element, if the pitches between the support points at which the clamp portion is fixed to the rotation drum are $L1(1) \ldots L1(n)$ where n is an integer not less than 1, and the pitches between both end portions of the clamp portion and supports closest to the both end portions thereof are $L2(1)$ and $L2(2)$, then $L1(1) \ldots L1(n)$ and $L2(1)$ and $L2(2)$ are set so that the maximum deformation amounts $\Delta L1(1) \ldots \Delta 0 L1(n)$ and $\Delta L2(1)$ and $\Delta L2(2)$ for the respective pitches during the rotation of the drum are substantially equal.

In the invention according to the first aspect and a second aspect of the present invention, when the rotation drum is rotated in a state in which a sheet is clamped by the clamp portion, due to a so-called centrifugal force being exerted, a force operates which causes the clamp portion to tend to come up off the surface of the rotation drum. In this case, because the supports are firmly fixed to the surface of the rotation drum, the deformation amount is insignificant, and the maximum amount of deformation is at the center of the length between the support points and is an arch-shaped deformation.

On the other hand, deformation of the length between the support points closest to the end portions and said end portions differ from the deformation of the length between the support points.

Even if deformation cannot be totally eliminated, extreme deformation of one portion in the longitudinal direction of the clamp portion (the axial direction of the rotation drum) can be avoided, and one side of the sheet (for example, the leading side) is thereby held by a substantially uniform nipping force. Thus, the coming up of the sheet from off the surface of the drum can be controlled.

In the first aspect of the present invention, as a means for avoiding extreme deformation of one portion, given that the pitches between the support points at which the clamp portion is fixed to the rotation drum are $L1(1) \ldots L1(n)$ where n is an integer not less than 1, and the pitches between both end portions of the clamp portion and support points closest to the both end portions is $L2(1) \ldots L2(2)$, then $L1(1) \ldots L1(n)$ and $L2(1)$ and $L2(2)$ are set so that the maximum deformation amounts $\Delta L1(1) \ldots \Delta L1(n)$ and $\Delta L2(1)$ and $\Delta L2(2)$ for the respective pitches during the rotation of the drum are substantially equal.

Further, the second aspect of the present invention is the invention according to the first aspect of the present invention, wherein $L(1) \ldots L1(n)$ are all set to be substantially equal to $L1$, and $L2(1)$ and $L2(2)$ for both end portions are set to be substantially equal to $L2$, and one of $L1$ and $L2$ is set, with the other of L1 and L2 as a reference, such that a deformation amount ΔL1 of L1 and deformation amount ΔL2 of L2 are substantially equal.

As a result, the deformation amounts ΔL1 between the support points are made substantially equal, and in order for ΔL1, as well as the deformation amount ΔL2 which occurs between a support point and one end portion (L2) to be made substantially the same, one of L1 and L2 is set with the other of the two as a reference. That is, even for clamps having the same amount of support points, by causing the relationship between L1 and L2 to be fixed, the maximum deformation amount is reduced.

The invention according to a third aspect of the present invention is the invention according to the second aspect of the present invention, wherein a dimension L2 between a support point and an end portion, is set by using a dimension L1 between support points, as a reference.

According to the third aspect of the present invention, by first setting L1 which is the dimension between the support points, adjusting L2 which is the dimension between a support and an end portion becomes comparatively easy, and thus the desired conditions can be easily obtained.

The invention according to a fourth aspect of the present invention is the invention according to the second aspect of the present invention, wherein the ratio (L2/L1) of the dimensions L2 between a support point and an end portion L1 to the dimensions between the support points, is plotted on the horizontal axis and the respective deformation amounts are plotted on the vertical axis, and the L2/L1 value at the point where the characteristic curves for the deformation amounts of L1 and L2 respectively intersect is made the set value.

According to the fourth aspect of the present invention, L2/L1 which is a relational expression of L1 and L2 is plotted on the horizontal axis and the deformation amounts between the support points as well as the deformation amounts between a support point and an end portion are plotted on the vertical axis. Curves are obtained in which as the dimension for one (of L1 and L2) increases, the deformation amount of said one increases. The point at which the two curves intersect is selected as the optimum point (the point of compromise between the two dimensions). The dimensions L1 between the support points and the dimensions L2 between a support point and an end portion are thus easily set.

The invention according to a fifth aspect of the present invention is the invention according to the second aspect of the present invention, wherein in a case in which there are three or more support points, at least one length between support points is selected.

According to the fifth aspect of the present invention, in the case where there are three or more support points, the dimension of at least two support points are used as the dimension between the support points. In such cases, since the dimensions between the support points are substantially equal, basically, one support point may be selected.

By the way, even if the dimension between the support points are substantially equal, depending on whether the number of support points is an odd number or an even number, the deformation amounts may differ. It may be thought that this difference is caused by whether or not a support point is located at the center of the clamp portion in the longitudinal direction thereof. That is to say, when there is a plurality of support points, for example if there are three, because the other two support points are separated from the support point at the center of the clamp portion by the same length L1, the deformation amounts for both lengths are the same. On the other hand, when there is a plurality of support points, for example four support points, the center of the length between the support points is at the position of the center of the clamp portion in the longitudinal direction and thus the conditions at that length between the support points, which length includes the center of the clamp portion, differ from the conditions at the lengths between the other support points. As a result the deformation amounts may also differ. In such cases, the lengths between the support points which include the center of the clamp portion, as well as the lengths between one of those support points and the other two support points are selected as L1 and these, along with the lengths L2 determine the conditions for the least amount of deformation. For example, using a relational expression such as that of the third aspect of the present invention, the point of compromise of the three curves is determined.

The invention according to a sixth aspect of the present invention is the invention according to the fourth aspect of the present invention, wherein 0.37<L2/L1<0.43.

According to the sixth aspect of the present invention, the L2/L1 value is based on the results of experiments (See the Detailed Description of the Invention.) and by L2/L1 being set in this range, high speed rotation of the rotation drum becomes possible.

DESCRIPTION OF THE PREFERRED EMBODIMENTS

Figure 1:
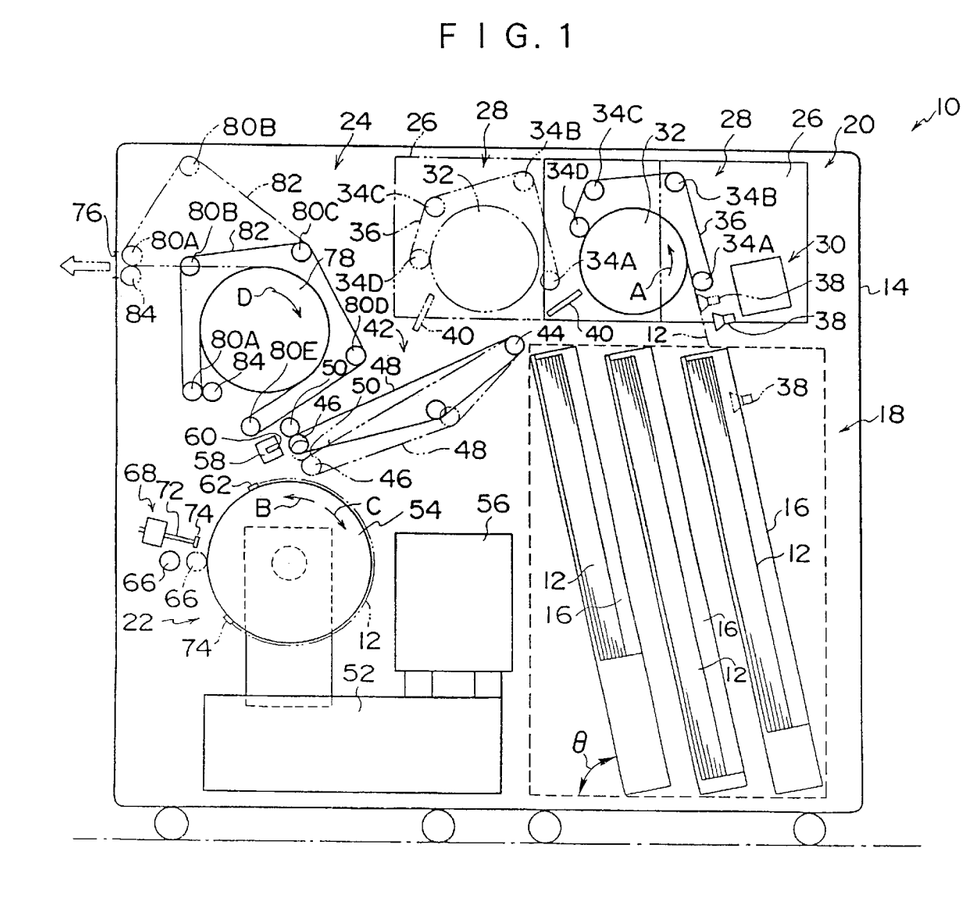
FIG. 1 is a schematic structural diagram illustrating an image exposure device suitably used in the present invention.

Hereinafter, an embodiment of the present invention will be described with reference to the drawings. In FIG. 1, the schematic structure of the image exposure device 10 suitably used in the present invention is illustrated. In this image exposure device 10, a photosensitive planographic printing plate in which a photosensitive layer is formed on a support body which is formed as a thin rectangular sheet (of a thickness of about 0.3 mm) made of aluminum, for example, is used as the sheet body (referred to as printing plate 12 hereinafter). A light beam which is modulated based on the image data is irradiated on the printing plate 12 and it is thereby scan-exposed. In the image exposure device 10, the printing plate 12 which has completed image exposure is subjected to a developing process or the like in an automatic developing device not shown.

The image exposure device 10, is structured such that within the machine frame 14, the cassette loading section 18, the feed plate conveying section 20, the recording section 22 and the discharge buffer section 24, and the like are disposed. The cassette loading section 18 is disposed within the machine frame 14 at the lower right side of the page in FIG. 1. A plurality of cassettes 16, in each of which a plurality of printing plates 12 are accommodated, are loaded so as to be in a state in which they are inclined at a predetermined angle θ.

In the image exposure device 10, it is possible for printing plates 12 having a plurality of sizes and different width dimensions to be processed. Printing plates 12 having one of the sizes, are placed in the cassette 16 such that the photosensitive layer is at the upper side. The printing plates 12 are positioned such that one end is at a predetermined position and they are stored in this manner. Further, in the cassette loading section 18, a plurality of cassettes 16 are loaded such that they are spaced apart at a predetermined distance and such that the height at one end of each of the printing plates 12 which are loaded inside the cassettes 16 is substantially the same.

The feed plate conveying section 20 is disposed above the cassette loading section 18, and the recording section 22 is adjacent to the cassette loading section 18 and disposed at a lower portion of the center of the device. In the feed conveying portion 20, a pair of side plates 26 (only one is illustrated in FIG. 1) is disposed and on these side plates 26, an inversion unit 28 and a leafing unit 30 are attached.

The inverting unit 28 includes inverting rollers 32 which have a predetermined external diameter dimension. A plurality of small rollers (in this embodiment, as an example, four small rollers 34A, 34B, 34C and 34D) are provided in the vicinity of inverting roller 32. The small rollers 34A–34D are disposed so that their range is from the cassette loading section 18 side, over the inverting roller 32, through to the recording section 22 side, and an endless conveyor belt 36 is trained around these small rollers 34A–34D. As a result of this, the conveyor belt 36 is trained from the small roller 34A through to the small roller 34D around approximately half of the circumference of the inverting roller 32.

The leafing unit 30 is provided with a plurality of suckers 38 which suction the upper end portion of the printing plates 12 which are inside the cassette 16. The suckers 38 are moved in the lower direction so as to oppose to the top end portions of the printing plates 12 in the cassettes 16 which are loaded in the cassette loading section 18. The printing plates 12 are then suctioned by these suckers 38. Further, the leafing unit 30 by causing the suckers 38 which suck the printing plate 12 to be moved in a substantially downward direction, pulls the printing plate 12 out from the cassette 16 and inserts the leading end of the printing plate 12 between the inverting roller 32 and the conveyor belt 36. In FIG. 1, an outline of the movement position of the suckers 38 is illustrated by a double-dot chain line.

The inverting unit 28 rotates the inverting roller 32 and the conveyor belt 36 in the direction in which the printing plate 12 is pulled from the cassette 16 (the direction of arrow A in FIG. 1). Thus the printing plate 12 which is nipped between the inverting roller 32 and the conveyor belt 36 is pulled out from the cassette 16. At the same time, by being wound onto the peripheral surface of the inverting roller 32, the printing plate 12 is conveyed and inverted while being curved. Incidentally, the radial dimension of the inverting roller 32 is such that when the printing plate 12 is curved, cracks or bends are not generated. (For example, the radius is less than or equal to 100 mm.)

As illustrated by the solid line and the two-dot chain line in FIG. 1, the side plate 26 moves horizontally in accordance with the position of the cassette 16 from which the printing plate 12 is being pulled out. Thus, the suckers 38 of the leafing unit 30 face the printing plates 12 within the cassette 16 which is selected.

Further, at the side plate 26, a guide 40 is provided below the small roller 34D. At the roller 34D side, the printing plate 12 which is inverted by the inverting roller 32, is sent toward the guide 40, between the inverting drum 32 and the conveyor belt 36. In addition, the conveyor 42 is disposed above the recording section 22, and the printing plate 12 which is sent out from the inverting unit 28 is guided to the conveyor 42 by the guide 40.

The guide 40 swings in accordance with the movement of the side plate 26 such that the printing plate 12 is always guided in the direction of the conveyor 42. Further, the roller 34D which is on the recording section 22 side, can move in accordance with the movement of the side plate 26 so as to change the conveying direction of the printing plate which is sent from the inverting unit 28. When the small roller 34D moves, the small roller 34C moves such that a tension applied to the conveyor belt 36, remains substantially the same. Thus, the printing plate which is sent from the inverting unit 28, is considerably curved by the guide 40.

The conveyor 42 is structured such that the conveyor belt 48 is trained between the roller 44 which is adjacent to the area below the feed plate conveying section 20, and the roller 46 which is adjacent to the area below the recording section 22, and inclined such that the roller 46 side is lower. A roller 50 which opposes the roller 46 is disposed at the conveyor 42. The printing plate 12 which was sent on the conveyor 42 is conveyed on the conveying belt 48 and nipped between the rollers 46 and 50.

At the recording section 22, a rotation drum 54 and a recording head 56 is mounted on a base 52. Further, a puncher 58 is disposed above the rotation drum 54. The conveyor 42 is nipped by the rollers 46 and 50, and the leading end of the printing plate 12 is inserted into the holding opening 60 of the puncher 58 and held. When the leading end of the printing plate 12 is inserted into the holding opening 60 of the puncher 58, punch holes which are used for positioning are formed at a predetermined position on the leading end of the printing plate 12.

After the punch holes are formed in the printing plate 12, the conveyor 42 along with the conveyor belt and the rollers 46 and 50 operate in the opposite direction and the leading end of the printing plate 10 is pulled out from the holding opening 60. Further, the conveyor 42 is provided with an unillustrated swinging means. Due to this swinging means, the conveyor 42 is moved downwards with the roller 44 side being an axis, such that the roller 46 side is adjacent to the rotation drum 54 in recording section 22. Thus, the leading end of the printing plate 12 which is on the conveyor belt 48 is set so as to be toward a predetermined position on the peripheral surface of the rotation drum 54 and the printing plate 12 is conveyed on the conveyor belt 48 toward the rotation drum 54.

The rotation drum 54 is rotated by an unillustrated driving means in the mounting and exposing direction (the direction of arrow B in FIG. 1) and also in the direction which is opposite to the mounting and exposing direction. The direction opposite to the mounting and exposing direction is the direction in which the printing plate will be removed (the direction of arrow C in FIG. 1).

Figure 2:
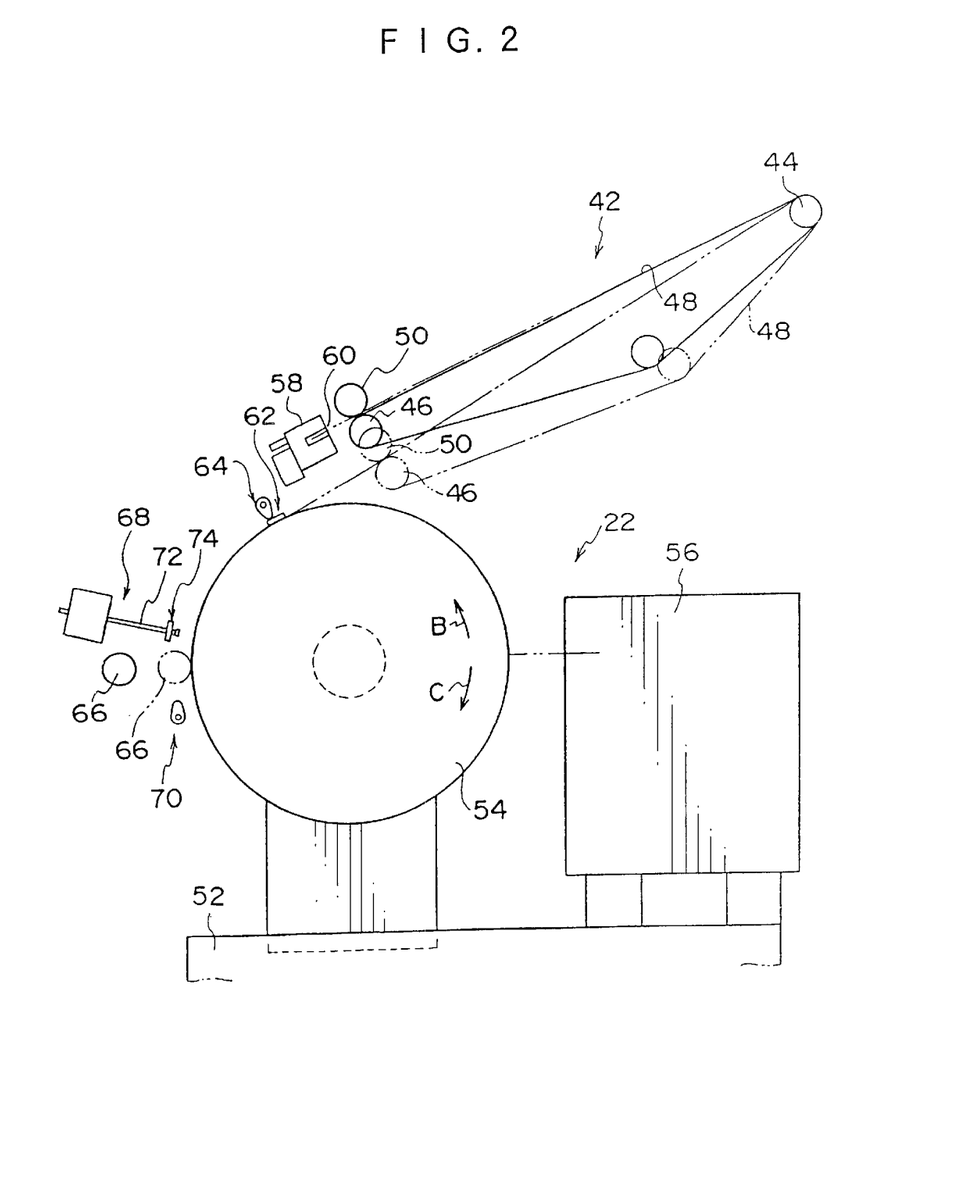
FIG. 2 is a schematic structural diagram illustrating a recording section of the image exposure device.

As illustrated in FIG. 2, a leading end chuck 62 which is a fixing means is mounted at a predetermined position on the peripheral surface of the rotation drum 54 which is provided at the recording section 22. At the time when the printing plate 12 is to be loaded on this rotation drum 54, first, the leading end chuck 62 stops the rotation drum 54 at a position which opposes the leading end of the printing plate 12 which was sent out by the conveyor 42.

At the recording section 22, a mounting cam 64 which opposes the leading end chuck at the print plate mounting position is provided. Due to the mounting cam 64 being rotated and one end side being pressed downwards, the printing plate 12 can be inserted between the leading end chuck 62 and the peripheral surface of the rotation drum 52. At the recording section 22, in a state in which the leading end of the printing plate 12 is inserted between leading end chuck 62 and the rotation drum 54, the mounting cam 64 rotates and the due to the pressing force on the distal chuck 62 being released, the leading end of the printing plate 12 is nipped and held between the leading end chuck 62 and the peripheral surface of the rotation drum 54. At this time, unillustrated positioning pins which protrude toward predetermined positions on the rotation drum 54 are inserted into the punch holes which were formed in the printing plate 12 by the puncher 58. Thus, the printing plate 12 is positioned on the rotation drum 54.

In the recording section 22, after the leading end of the printing plate 12 is fixed to the rotation drum 54, the rotation drum rotates in the mounting and exposing direction. Thus the printing plate 12 which is sent in from the conveyor 42 is wound onto the peripheral surface of the rotation drum 54.

In the vicinity of the rotation drum 54, squeeze rollers 66 are disposed further downstream in the mounting and exposing direction than the printing plate mounting position. By the squeeze rollers 66 moving in the direction of the rotation drum 54, the printing plate which is wound onto the surface of the rotation drum 54 is pressed down onto the rotation drum 54 and the printing plate 12 is thereby brought in close contact with the peripheral surface of the drum.

Further, in the recording section, a trailing end chuck mounting and dismounting unit 68 is disposed in a vicinity further upstream in the mounting and exposing direction of the rotation drum 54 than the squeeze rollers 66 and a removal cam 70 is disposed in a downstream vicinity in the mounting and exposing direction. On the trailing end chuck mounting and dismounting unit 68, the trailing end chuck 74 of the shaft 72 which protrudes toward the rotation drum 54 is mounted.

At the recording section 22, when the printing plate 12 which is wound onto the rotation drum 54 opposes the trailing end chuck mounting and dismounting unit 68, the shaft 72 is caused to protrude and the trailing end chuck 74 is mounted at a predetermined position of the rotation drum. Thus, the printing plate 12 is nipped and held between the trailing end chuck 74 and the rotation drum 54.

At the recording section 22, when the leading end and the trailing end of the printing plate 12 are held on the rotation drum, the squeeze rollers 66 are removed. Subsequently, at the recording section 22, while the drum is rotated at a predetermined high speed, a light beam is radiated so as to be in synchrony with the rotation of the rotation drum 54 and modulated based on the image data from the recording head portion 56. The printing plate 12 is thereby scan-exposed based on the image data.

In the recording section 22, when scan exposure on the printing plate 12 is complete, the trailing end chuck 74 which holds the trailing end of the printing plate 12, stops the rotation drum 54 at a position at which it faces the trailing end chuck mounting and dismounting unit 68. At the same time, the printing plate 12 is nipped between the rotation drum 54 and the squeeze rollers 66. When the trailing end chuck mounting and dismounting unit 68 faces the trailing end chuck 74 and the rotation of the rotation drum is stopped, the trailing end chuck 74 is then taken from off the rotation drum 54 and as a result, the trailing end of the printing plate 12 is released.

In the recording section 22, when the trailing end chuck 74 is taken from off the rotation drum 54, the rotation drum rotates in the direction in which the printing plate 12 is being taken off. Thus, the printing plate 12 is sent, from the trailing end side, out from between the squeeze roller 66 and the rotation drum 54.

As illustrated in FIG. 1, the discharge buffer section 24 is provided at the upper side of the squeeze roller 66, and by the rotation drum 54 being rotated in the direction in which the printing plate 12 is taken off, the printing plate 12 is sent from the trailing end side, out to the discharge buffer section 24. Further, the rotation drum 54 is rotated in the direction in which the printing plate 12 is taken off, and stops at a position for removing the printing plate where the removing cam 70 faces the leading end chuck 62. At the recording section 22, by the removing cam 70 being rotated, the leading end chuck 62 is pressed down and the nipped state of the leading end printing plate 12 between the leading end chuck 62 and the rotation drum 54 is released. Thus, the printing plate 12 is taken off from the rotation drum 54.

The discharge buffer section 24 is equipped with a discharge roller 78 which is provided at an inner side of the discharge opening 76 which is formed in the machine frame 14. A plurality of small rollers (for example, small rollers 80A, 80B, 80C, 80D, and 80E) are disposed around the discharge roller 78. An endless conveyor belt 82 is trained between these small rollers 80A through to 80E. As a result the conveyor belt is trained, via the small rollers 80A–80E, so as to span a range which is between ½ and ¾ of the circumference of the discharge roller 78.

The small roller 80A is disposed so as to protrude toward the squeeze roller 66 side of the recording section 22 and to face the roller 84. The printing plate 12 which is sent from the recording section 22 is guided between the roller 84 and the small roller 80A and is nipped between the small roller 80A and the roller 84.

At the discharge buffer section 24, by the discharge roller 78 being rotationally driven in the direction in which printing plate 12 is pulled in (the direction of arrow D), the printing plate 12 which is nipped by the small roller 80A and the roller 84 is pulled out from the recording section 22 while being guided between the discharge roller 78 and the conveyor belt 82. The printing plate 12 is nipped between the discharge roller 78 and the conveyor belt 82 and wound around the discharge roller 78. At this time, at the buffer discharge portion 24, the leading end portion of the printing plate 12 (at the leading end chuck 62 side in the recording section 22), is nipped between the small roller 80A and the roller 54 to thereby primarily hold the printing plate 12 which is wound onto the discharge roller 78.

On the other hand, as illustrated by the double-dot chain line in FIG. 1, at the discharge buffer section 34, the small roller 80A and the roller 84 move to a position where they face the discharge opening 76. At this time, by the small roller 80A and the idle roller 84 rotating integrally with each other, the leading end of the printing plate 12 is caused to be toward the discharge opening 76. Incidentally, the small roller 80B which is above the small roller 80A, moves in accordance with the movement of the small roller 80A and a uniform tension is applied to the conveyor belt 82.

At the discharge buffer section 24, when the leading end of the printing plate 12 is toward the discharge opening 76, the discharge roller 78 is driven so as to rotate in the direction in which the printing plate 12 is sent out (the direction opposite to the direction of arrow D in FIG. 1), at a rotation speed which corresponds with conveying speed of the printing plate 12 when in a processing device such as an automatic development device or the like which is disposed so as to be adjacent to the discharge opening.

Incidentally, the leading end chuck 62 and the trailing end chuck 74 are mounted on the rotation drum 54 as a fixing device for fixing the printing plate 12.

Figure 3:
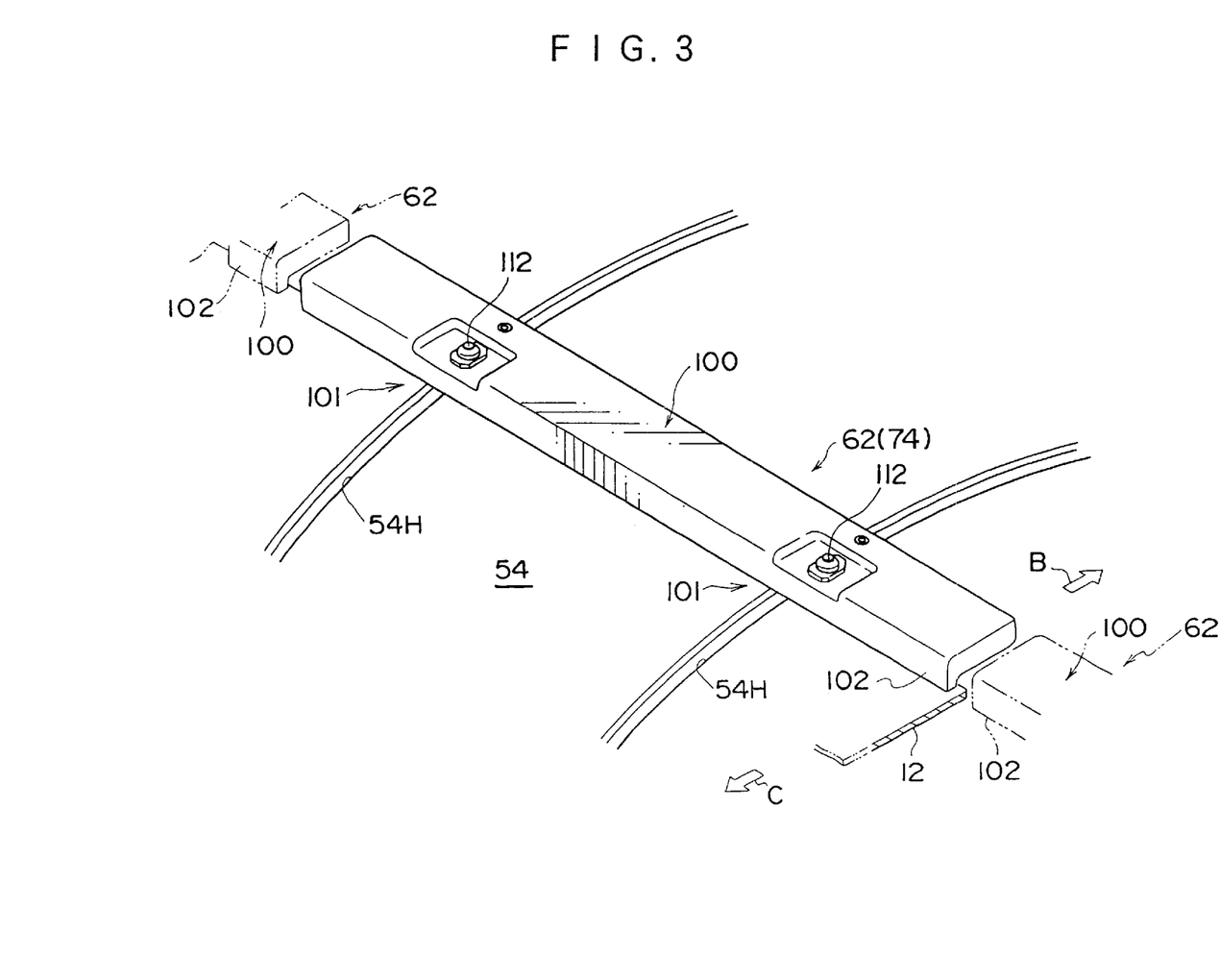
FIG. 3 is schematic perspective diagram illustrating a leading end chuck used in the present invention.

As illustrated in FIG. 3, the leading end chuck 62 is provided with a clamp 100 which is formed in a plate shape and has predetermined length. The clamp 100 is disposed along the axial direction of the rotation drum 54. On the rotation drum 54, a plurality of clamps 100 is disposed in a line with a predetermined distance between them.

Mounting portions 101 for mounting to the rotation drum 54 are provided at a plurality of locations (two locations in this embodiment) in the longitudinal direction of the clamps 100. The clamps 100 are disposed on the peripheral surface of the rotation drum so as to be substantially parallel to the rotation axis of the drum and, due to the mounting portion 101, are in a state of being in contact with the rotation drum 54.

Each mounting portion 101 includes a support 112. The lower end portion of the support 112 is formed so as to be inserted into a circular groove portion 54H formed on the peripheral surface of the drum 54, is movable along the groove portion 54H, and may be fixed to any suitable position. The cross section of the groove portion 54H may, for example, have an upside down T-shape.

The entire region of one side in the longitudinal direction of the clamp 100 is formed as the clamp portion 102. When the printing plate 12 is fixed to the rotation drum 54, an urging force is generated such that the printing plate 12 is nipped between the peripheral surface of the rotation drum 54 and the clamp portion 102.

However, in a case where the rotation drum 54 rotates at a high speed, the clamp portion 102 acts against the urging force of the rotation drum 54 due to a so-called centrifugal force and attempts to separate from the rotation drum 54.

At this time, the amount of deformation due to the centrifugal force is negligible at the mounting portion 101 (hereinafter referred to as the support point 101 upon occasion) because it is firmly fixed so as to be in contact with the rotation drum 54. However, the deformation amount is exceedingly large at the center of the length between the support points 101. As a result, the clamp 100 deforms in a bow shape between the support points 101. The deformation amount ΔL1 increases as the length of the dimension L1 between the support points 101 increases.

On the other hand, the support points 101 which are closest to the end portion of the clamp 100 in the longitudinal direction (in the present embodiment, two support points 101 correspond to both end portions respectively) deforms most at the end portion which are free. This deformation amount ΔL2 increases as the length of the dimension L2, between one end portion (of the clamp 100) and the support point 101, increases.

In view of the above, if each of the dimensions L1 and L2 are both made small, the deformation amounts of L1 and L2 can be lessened. However, if the dimensions L1 and L2 are made small, the number of the groove portions 54H formed on the rotation drum 54 will have to be increased accordingly, and there is a limit to how many groove portions 54H can be formed on the drum 54.

Therefore in this embodiment, given a condition where the number of support points 101 is kept at the present number, the ratio dimension L1 between the support points 101 and the dimension L2 between the support point 101 and one end portion of the clamp 100, must be selected such that the total deformation amount is minimized. Thus, the position of the support points 101 are determined based on the characteristic diagram illustrated in FIG. 4.

Figure 4:
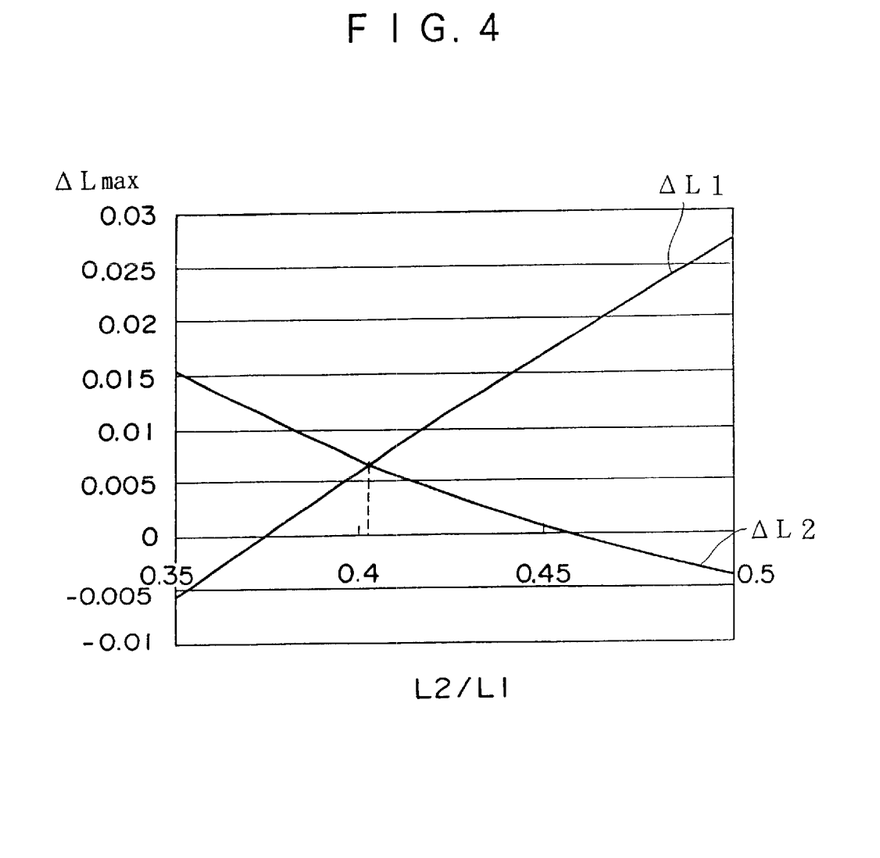
FIG. 4 is a characteristic diagram showing maximum deformation amounts between one support point and another, and between a support point and one end portion of the clamp with a dimension ratio L2/L1 for setting the position of the support points on the x-axis.

As illustrated in FIG. 4, L2/L1 is shown on the X-axis while on the Y-axis, the maximum deformation amount $\Delta L_{max}$ for each ratio is shown. As seen from FIG. 4, the deformation amount changes such that the curve showing the deformation amount ΔL1 slopes upward from the left while that showing L2 slopes upwards from the right. Because the difference between both deformation amounts is at a minimum when the two curves intersect, the ratio at this point (L2/L1) is selected. By this being determined as the position of the support points 101, deformation per se cannot be eliminated, but deformation along the longitudinal direction of the clamp 100 is made substantially uniform. As a result incline and the like of the printing plate 12 on the rotation drum 54 caused by a distorted nipping force can be eliminated. According to the present embodiment, the value L2/L1 at the point of intersection is approximately 0.4, and in a case where there are two support points 101, they can be set independently of the length of the clamp 100, based on the above ratio (L2/L1≈0.4).

The application of the present embodiment is described below.

In the image exposure device 10, the image data for exposing the printing plate 12 is input, the size and number of the printing plates 12 which are to be exposed are set. When instructions are given for the image exposure to begin, the image exposure processes to be carried out for the printing plate 12 begin. Incidentally, these processes may be such that an operation panel is provided at the image exposure device 10 and instructions are given by the operation of a switch of the operation panel. The processes may also be such that the instructions for the image exposure device 10 to start processing is given by a signal for an image processing device and the like which outputs image data to the image exposure device 10.

At the image exposure device 10, when instructions are given for the processes to start, the inverter unit 28 and the leafing unit 30 are both moved to a position of a cassette 16 into which the printing paper of the size instructed is accommodated. The printing plate 12 is then pulled out from inside the cassette 16 by being sucked by suckers 38 and sent between the inverting roller 32 of the inverting unit 28 and the conveyor belt 36. As a result, the printing plate 12 is nipped between the inverting roller 32 and the conveyor belt 36 and then sent to the conveyor 42.

The conveyor 42 inserts the leading end of the printing plate 12 into the holding opening 60 of the puncher 58 and the puncher 58 punches a cut-out used for positioning, at a predetermined position on the printing plate 12. When the cut-out is punched into the printing paper 12, the conveyor 42 pulls out the printing plate 12 from the holding opening 60 of the puncher 58 and sends the printing plate 12 towards the peripheral surface of the rotation drum 54.

In the recording section 22, when the leading end of the printing plate 12 is held onto the drum 54 by the leading end chuck 62, the printing plate 12 is wound onto the rotation drum 54 while being squeezed by the squeeze rollers 66 and the trailing end of the printing plate 12 is held onto the rotation drum 54 by the trailing end chuck 74.

Subsequently, in the recording section 22, while the rotation drum is being rotated at a high speed, a light beam based on the image data from the recording head portion 56 is radiated onto the printing plate 12 and the printing plate 12 is thereby scan-exposed. When the scan-exposure of the printing plate 12 is complete, the trailing end chuck 74 is removed from the rotation drum 54 and the printing plate 12 is sent to the discharge buffer section 24.

In the discharge buffer section 24, the printing plate 12 is nipped and conveyed by the small roller 80A and the roller 84 and then wound onto the discharge roller 78. Subsequently, the small roller 80A and the roller 84 face the discharge opening 76 and the printing plate 12 is sent out from the discharge opening at a predetermined conveying speed. At this point, the clamp 100 for holding the leading end and the trailing end of the printing plate 12 presses down and holds the printing plate 12 using the urging force of the clamp portion 102 which is provided continuously along one longitudinal direction of the clamp 100.

However, in the present embodiment, there are two predetermined positions where the clamp 100 is placed on the rotation drum 54 (support points 101). At those locations which correspond to those other than support points 101 of the clamp portion 102, due to the so-called centrifugal force which is generated when the rotation drum 54 rotates at a high speed, the force which acts against an urging force and presses the clamp down is decreased. (In the worst case, the printing plate 12 comes up off the rotation drum 54.)

In the present embodiment, the positions of the support points 101 are determined based on the characteristic curves of FIG. 4 in order to decrease the deformation amounts. That is, from FIG. 4, the value at the point of intersection between the maximum deformation amount $\Delta_{MAXL1}$ between the support points 101 and the maximum deformation amount $\Delta_{MAXL2}$ between the support point 101 and one end portion is selected. The position of the support points 101 on the clamp 100 is set based on the value L2/L1 at this point of intersection.

This value which is set, is effective when the number of the groove portions 54H on the rotation drum 54 cannot be changed (increased). The support points 101 can be set at the above ratio without taking into consideration the entire length of the clamp 100.

The basis of the above is as explained below.

The clamp 100 deforms into a bow shape between the support points 101. On the other hand, at the length between the support point 101 and the end portion, the deformation of the free end is extreme. The deformation amounts $\Delta L1$ and $\Delta L2$ vary in accordance with the difference between the dimension L1 between support points 101 and the dimension L2 between a support point and one end portion.

By using the ratio of the dimension L1 between support points 101 and the dimension L2 between a support point and one end portion, a point of compromise between the two dimensions can be located and the positions of the support points 101 can be determined. The deformation amount per se can not be eliminated, but the deformation can be made substantially even along the longitudinal direction of the clamp 100 and the incline and the like of the printing plate 12 on the rotation drum 54 caused by a distorted nipping force can be eliminated.

In the case where there are two support points 101, the value at of L2/L1 at the point of intersection is approximately 0.4 and this value is independent of the length of the clamp 100.

In the present embodiment, in the clamp 100 which has two support points 101 with the dimension L1 between the two support points 101 and the dimension L2 between a support point and one end portion, the positions of the support points 101 are determined such that when a centrifugal force caused by high speed rotation of the drum 54 is exerted, the deformation amount when the urging force acts against the clamp portion 102 is uniform along the entire length of the clamp 100. As a result of this, the nipping force of the printing plate 102 is uniform along the entire region of the clamp 100, thus the problem of the printing plate 12 coming up off the drum 54 is eliminated.

MODIFIED EXAMPLE 1

Figure 5:
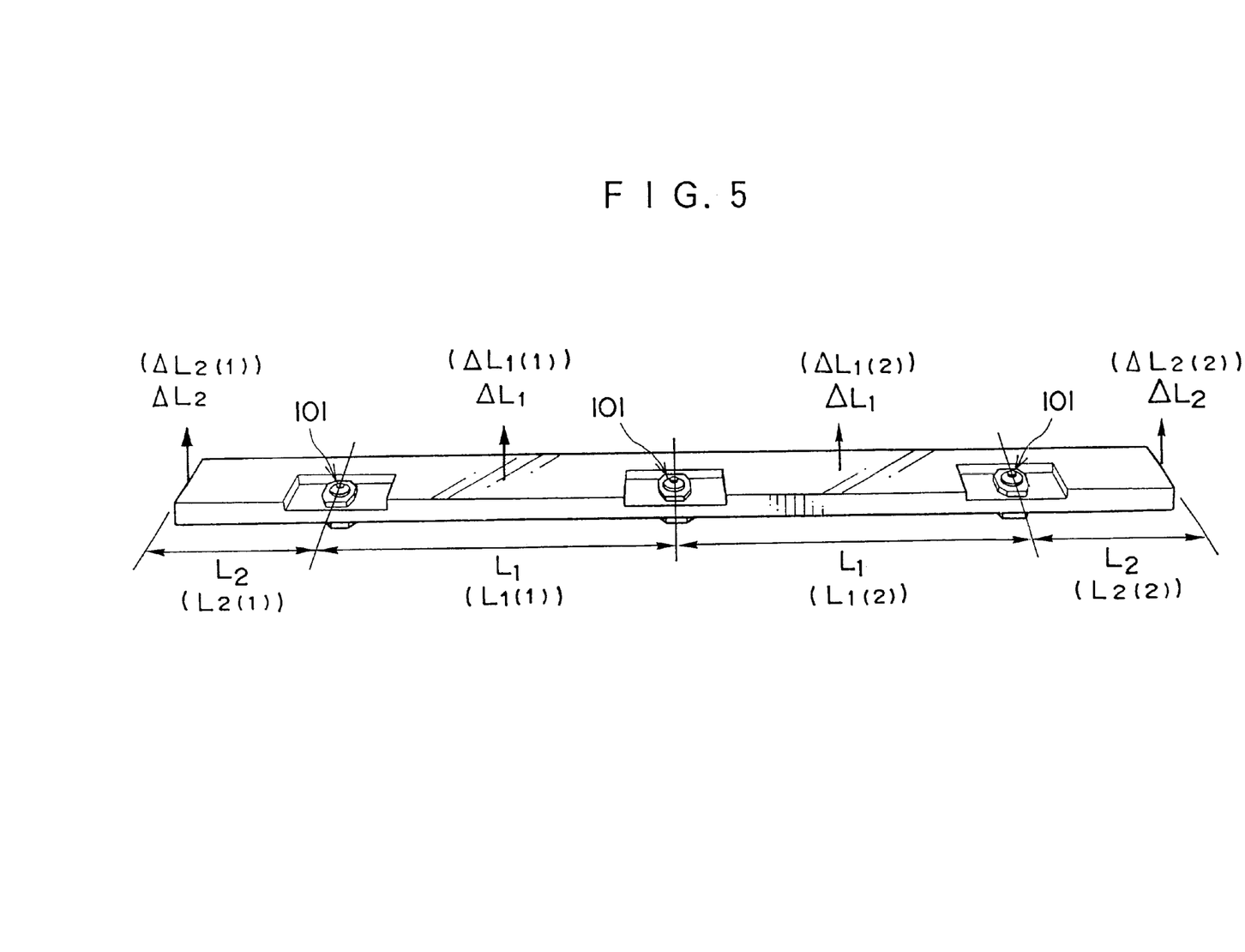
FIG. 5 is a perspective diagram of the clamp of a first modified example.
Figure 6:
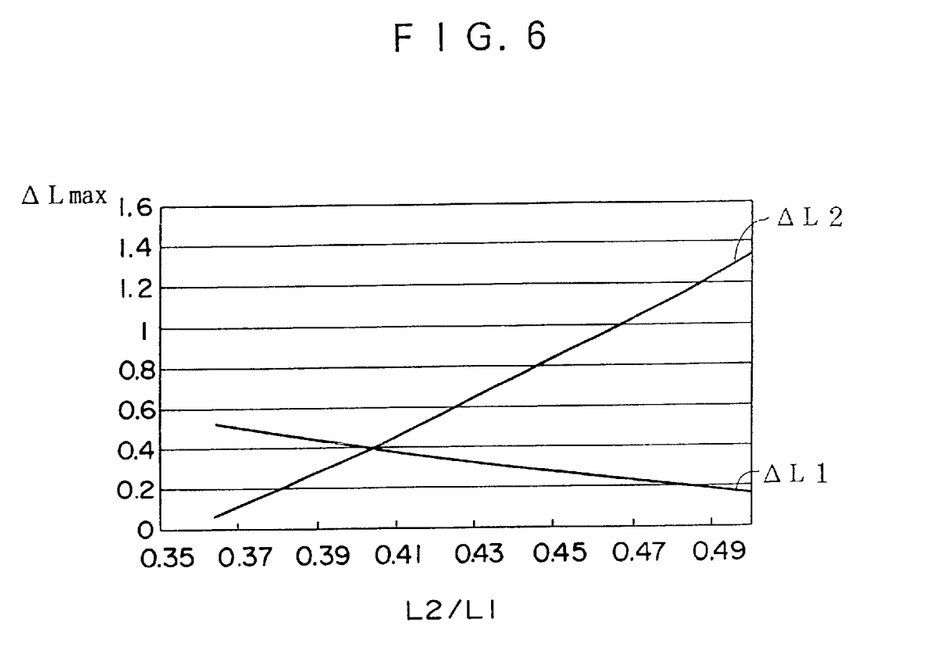
FIG. 6 is a characteristic diagram according to the first modified example, showing maximum deformation amounts between support points and between a support point and one end portion of the clamp, with a dimension ratio L2/L1 for setting the position of the support points on the x-axis.

In FIG. 5, a clamp 100 having three support points 101 is illustrated. In this case since the middle support point 101 is in the center of the entire length of the clamp 100, the deformation amounts $\Delta L1$ for the two dimensions L1 which are equidistant in both end directions from the middle support point, are equal. Any one of these deformation amounts is selected and compared with the deformation amount L2 for the L2 dimension between the support point 101 and one end portion (See FIG. 6). As illustrated in FIG. 6, in the case where there are three support points 101, the L2/L1 value at the intersection point of each of the deformation amounts is 0.405. By determining the positions of the three support points 101 based on this ratio, the deformation amounts can be made uniform.

Two types of clamps such as those illustrated in Table 1, having three supports points were used to carry out the experiment. Both clamps are made of the same material and have the same cross-sectional configuration and the like.

TABLE 1

| | Clamp Dimensions | | | |
| --- | --- | --- | --- | --- |
| | Total length 2L1 + 2L2 | L1 | L2 | L2/LI |
| Type 1 | 300 mm | 100 mm | 50 mm | 0.5 |
| Type 2 | 300 mm | 105 mm | 45 mm | 0.43 |

TABLE 2

| | Experiment Results | | |
| --- | --- | --- | --- |
| | 1000 rpm | 1400 rpm | 1600 rpm |
| Type 1 | yes | no | no |
| Type 2 | yes | yes | no |
| Deformation Amount (Centrifugal Force) Value | 1 | 1.96 | 2.56 |

In Table 2, "yes" indicates that the coming up of the printing plate in the vicinity of the clamp is within a permissible range, and "no" indicates that it is not within a permissible range.

As can be seen from Table 2, even for clamps having the same total length, high speed which is approximately 40% greater than that with a clamp of the prior art, becomes possible. As illustrated in FIG. 6, this is related to the fact that the maximum deformation amount (ΔL max) for a clamp of type 2 (L2/L1=0.43) is approximately half of what it is for the clamp of type 1 (L2/L1=0.5).

Further, as can be seen from FIG. 6, when L2/L1=0.4, the device can have an even higher speed.

Figure 8:
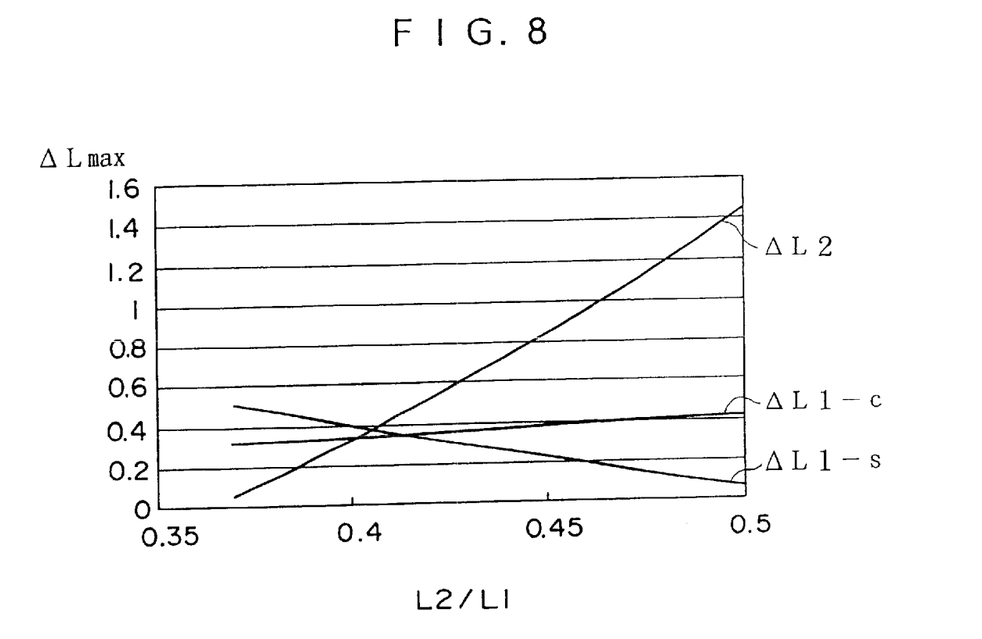
FIG. 8 is a characteristic diagram according to the second modified example, showing maximum deformation amounts between support points, and between a support point and one end portion of the clamp, with a dimension ratio L2/L1 for setting the position of the support points on the x-axis.

Also, as is seen from FIGS. 4, 6 & 8, the deformation amount when the range is 0.37<(L2/L1)<0.43 is less than half of what it is compared to when L2/L1=0.5. Accordingly, it can be thought that even when there are two to four support points, effects can be obtained which are similar to those of type 2.

MODIFIED EXAMPLE 2

Figure 7:
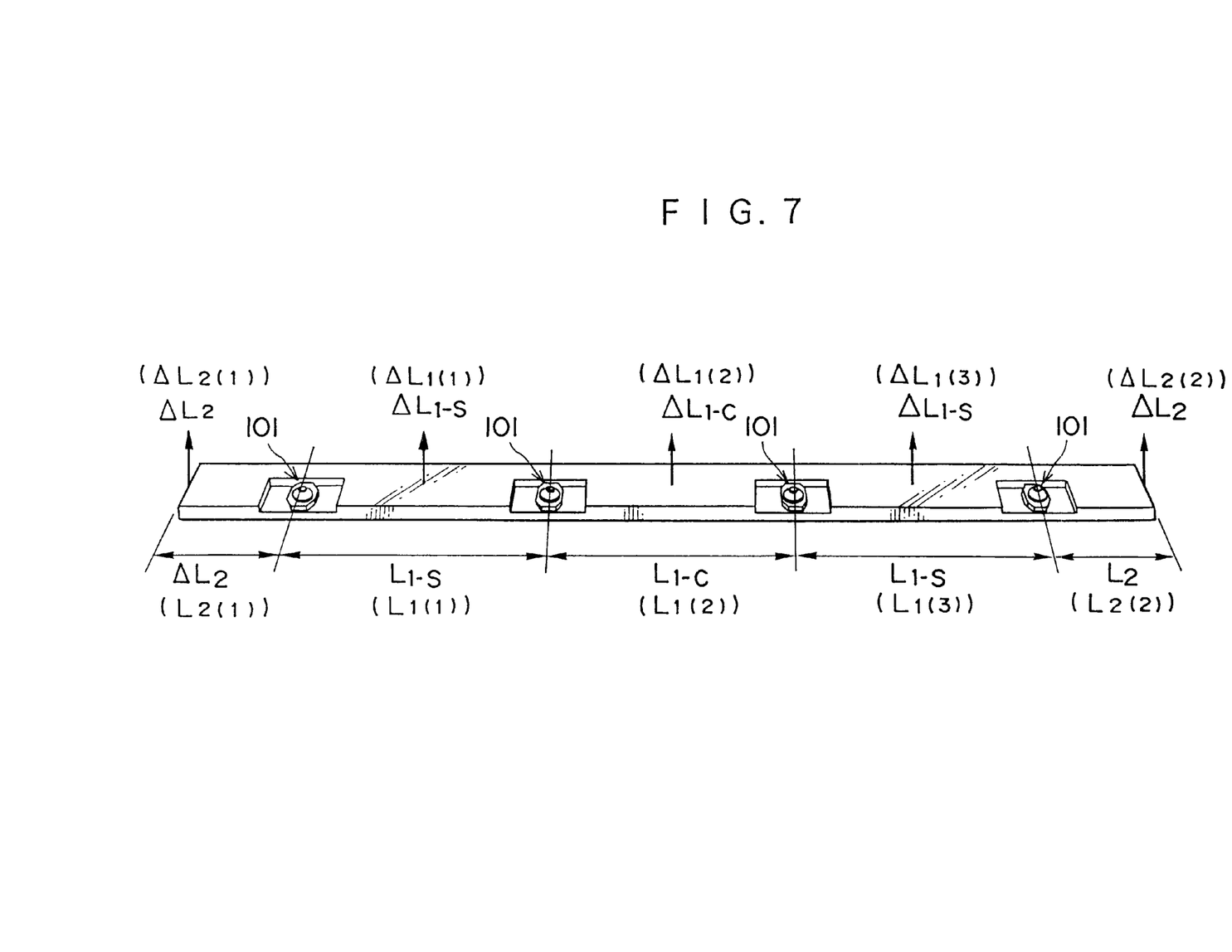
FIG. 7 is a perspective diagram of a clamp of a second modified example.

In FIG. 7, a clamp having four support points 101 is illustrated. In this case, because the two inner support points 101 are positioned at the center of the entire length of the clamp 100, even if the dimension $L1_C$ between the two inner support points 101 and the dimension $L1_S$ between the two outer support points 101 and the two inner support points 101 are the same, because the conditions are different, the deformation amounts $\Delta L1_C$ and $\Delta L1_S$ have different values.

In FIG. 8, the three deformation amounts $\Delta L1_C$, $\Delta L1_S$ and $\Delta L2$ for the dimensions $L1_C$ and $L1_S$ the dimension L2 between a support point 101 and one end portion are compared. The x-axis represents L2/L1 as in the previous embodiment since $L1=L1_C=L1_S$.

As shown in FIG. 8, in the case of four support points 101, the value of L2/L1 at the intersection point of each of the deformation amounts (in this case the approximate point) is 0.410. By determining the positions of the four support points 101 based on this ratio, the deformation amount can be made uniform.

According to the embodiment, the modified example 1 and the modified example 2, it can be seen that uniformity of deformation can be attained by setting the value of L2/L1 to approximately 0.4 without taking into consideration the length of the clamp 100 or the number of the support points 101. Further, although in the present embodiment, the modified example 1 and the modified example 2, the leading end chuck was used as a basis for the description, the position of the support points 101 on the trailing end chuck is determined in a similar manner.

Also, the structure of the present invention is not limited to the structures described above. In the present embodiment of the leading end chuck 62 and the trailing end chuck 74 suitably applied in the present invention, the printing plate 12 is wound around the drum 54 and is scan-exposed so as to correspond with the rotation of the drum 54 using an image exposure device 10. However, the image exposure device is not limited to the image exposure device 10 and an image exposure device having any structure in which the printing plate 12 is wound onto the rotation drum 54 and scan-exposed may be utilized.

Further, in the present embodiment the printing plate 12 is used as the sheet body, but the sheet body is not limited to the printing plate 12. Various types of photosensitive materials such as printing paper or photographic film may of course be used. Further, the sheet body is not limited to photosensitive materials. Various types of sheet bodies as well, may be suitably used as the sheet body which is wound onto the rotation drum and rotated when the sheet body fixing device is applied.

What is claimed is:

1. A sheet fixing device for holding a sheet in a state in which the sheet is wound around a peripheral surface of a rotation drum, the sheet fixing device comprising:

a clamp portion disposed along an axial direction at one portion of the peripheral surface of the rotation drum, at least one of a leading end portion and a trailing end portion of the sheet adapted to be nipped between the clamp portion and the peripheral surface of the rotation drum; and a fixing element for fixing the clamp portion to the peripheral surface of the rotation drum at each of a plurality of support points along an axial direction of the rotation drum, wherein when the clamp portion is fixed to the rotation drum by the at least one fixing element, if the pitches between the support points at which the clamp portion is fixed to the rotation drum are L1 (1) . . . L1 (n) where n is an integer not less than 1, and the pitches between each of the two end portions of the clamp portion and the support point closest to the respective end portion thereof are L2(1) and L2(2), L1(1) . . . L1(n) and L2 (1) and L2 (2) are set so that the maximum deformation amounts ΔL1 (1) . . . ΔL1 (n) and ΔL2 (1) and ΔL2 (2) for the respective pitches during the rotation of the drum are substantially equal.

2. The sheet fixing device according to claim 1, wherein L1 (1) . . . L1(n) are all set to be substantially equal to L1, and L2(1) and L2(2) for both end portions are set to be substantially equal to L2, and one of L1 and L2 is set, with the other of L1 and L2 as a reference, such that a deformation amount ΔL1 of L1 and deformation amount ΔL2 of L2 are substantially equal.

3. The sheet fixing device according to claim 2, wherein a dimension L2 between one of said plurality of support points and one of the two end portions, is set by using a dimension L1 between support points, as a reference.

4. The sheet fixing device according to claim 2, wherein the ratio (L2/L1) of the dimensions L2 between one of said plurality of support points and one of said two end portions to the dimensions L1 between the support points, is plotted on the horizontal axis and the respective deformation amounts are plotted on the vertical axis, and the L2/L1 value at the point where the characteristic curves for the deformation amounts of L1 and L2 respectively intersect is made the set value.

5. The sheet fixing device according to claim 4, wherein 0.37<L2/L1 <0.43.

6. The sheet fixing device according to claim 2, wherein in a case in which there are three or more support points, at least one length between support points is selected.

* * * * *